US012218243B2

(12) United States Patent
Sasaki (10) Patent No.: US 12,218,243 B2
(45) Date of Patent: Feb. 4, 2025

(54) SEMICONDUCTOR DEVICE, DISPLAY APPARATUS, AND MANUFACTURING METHOD OF SEMICONDUCTOR DEVICE

(71) Applicant: JOLED INC., Tokyo (JP)

(72) Inventor: Atsushi Sasaki, Tokyo (JP)

(73) Assignee: JOLED INC., Tokyo (JP)

( * ) Notice: Subject to any disclaimer, the term of this patent is extended or adjusted under 35 U.S.C. 154(b) by 497 days.

(21) Appl. No.: 17/657,066

(22) Filed: Mar. 29, 2022

(65) Prior Publication Data

US 2022/0320346 A1 Oct. 6, 2022

(30) Foreign Application Priority Data

Mar. 30, 2021 (JP) .................................. 2021-056354

(51) Int. Cl.
| | | |
|---|---|---|
| *H01L 29/786* | (2006.01) | |
| *B05D 1/26* | (2006.01) | |
| *H01L 29/66* | (2006.01) | |
| *H10K 59/12* | (2023.01) | |

(52) U.S. Cl.
CPC .......... *H01L 29/78636* (2013.01); *B05D 1/26* (2013.01); *H01L 29/66742* (2013.01); *H10K 59/12* (2023.02)

(58) Field of Classification Search
CPC ..................................................... H10K 59/12
USPC ........................................................ 257/340
See application file for complete search history.

(56) References Cited

U.S. PATENT DOCUMENTS

| | | | |
|---|---|---|---|
| 9,523,876 B2 * | 12/2016 | Kim ..................... | H10K 77/111 |
| 2014/0077171 A1 | 3/2014 | Yamakita et al. | |
| 2014/0339521 A1 | 11/2014 | Ozawa | |
| 2019/0214449 A1 * | 7/2019 | Ishiyama ............... | H10K 71/00 |
| 2019/0300771 A1 | 10/2019 | Cha et al. | |
| 2020/0227337 A1 | 7/2020 | Hamada | |
| 2020/0270423 A1 | 8/2020 | Nada et al. | |
| 2021/0317303 A1 * | 10/2021 | Oozeki ..................... | C08J 5/18 |

FOREIGN PATENT DOCUMENTS

| | | |
|---|---|---|
| JP | 2013196919 A | 9/2013 |
| JP | 2014229356 A | 12/2014 |
| JP | 6472590 B1 | 2/2019 |
| JP | 2019024045 A | 2/2019 |
| JP | 2019121734 A | 7/2019 |

(Continued)

*Primary Examiner* — Xia L Cross
(74) *Attorney, Agent, or Firm* — CHIP LAW GROUP (57) ABSTRACT

A semiconductor device includes a conductive resin layer that includes an insulating resin and first fillers dispersed in the insulating resin and has first and second main surfaces, and an element layer that is arranged on the first main surface and includes a semiconductor element. The first fillers are each a fibrous conductive filler. The conductive resin layer has a first surface layer section that includes the first main surface and has a thickness which is 30% of a thickness of the conductive resin layer, a second surface layer section that includes the second main surface and has a thickness which is 30% of the thickness of the conductive resin layer, and an intermediate layer section arranged between the first and second surface layer sections. First fillers have a smaller directional angle relative to the first main surface in the first surface layer section than in the intermediate layer section.

12 Claims, 7 Drawing Sheets

(56) References Cited

FOREIGN PATENT DOCUMENTS

| | | | |
|---|---|---|---|
| JP | 6568639 | B1 | 8/2019 |
| JP | 2020079381 | A | 5/2020 |
| JP | 6746540 | B2 | 8/2020 |
| JP | 6775594 | B2 | 10/2020 |
| WO | 2018062352 | A1 | 4/2018 |
| WO | 2019044864 | A1 | 3/2019 |

\* cited by examiner

SEMICONDUCTOR DEVICE, DISPLAY APPARATUS, AND MANUFACTURING METHOD OF SEMICONDUCTOR DEVICE

BACKGROUND

The present disclosure relates to a semiconductor device, a display apparatus, and a manufacturing method of the semiconductor device.

In recent years, semiconductor devices including a resin layer which is a flexible substrate (i.e., a substrate having flexibility) formed of resin and also including a semiconductor element have been proposed (e.g., Japanese Patent Laid-open No. 2019-121734, hereinafter referred to as Patent Document 1). In addition, flexible display apparatuses including such a semiconductor device and a display element layer including a plurality of pixels have been proposed.

In the semiconductor device described in Patent Document 1, a resin layer includes conductive fillers (i.e., micro conductors), seeking prevention of the lowering of characteristics of a semiconductor element by blocking an electrical field applied to the semiconductor element. Patent Document 1 depicts an example of conductive fillers having fibrous shapes.

SUMMARY

However, in a case where the resin layer includes fibrous conductive fillers, end sections of the conductive fillers stick out from main surfaces of the resin layer in some cases. This lowers the smoothness of the main surfaces of the resin layer. In a case where an insulating film, a semiconductor film, and a conductive film that are included in the semiconductor element are stacked on the main surfaces of the substrate having the low smoothness, the smoothness of each layer included in the semiconductor element lowers, and characteristics of the semiconductor element can lower.

The present disclosure has been made in view of the problem described above, and it is desirable to provide a semiconductor device including a conductive resin layer which includes fibrous conductive fillers and has highly-smooth main surfaces, a display apparatus having the semiconductor device, and a manufacturing method of the semiconductor device.

According to an embodiment of the present disclosure, there is provided a semiconductor device including a conductive resin layer that includes an insulating resin and a plurality of first fillers dispersed in the insulating resin and has a first main surface and a second main surface on a side opposite to the first main surface, and an element layer that is arranged on the first main surface and includes a semiconductor element. Each of the plurality of first fillers is a fibrous conductive filler. The conductive resin layer has a first surface layer section that includes the first main surface and has a thickness which is 30% of a thickness of the conductive resin layer, a second surface layer section that includes the second main surface and has a thickness which is 30% of the thickness of the conductive resin layer, and an intermediate layer section arranged between the first surface layer section and the second surface layer section. Among the plurality of first fillers, first fillers arranged in the first surface layer section have a directional angle relative to the first main surface which is smaller than a directional angle of first fillers arranged in the intermediate layer section.

According to another embodiment of the present disclosure, there is provided a display apparatus including the semiconductor device and a display layer that is arranged on the element layer and displays an image.

According to a further embodiment of the present disclosure, there is provided a method of manufacturing a semiconductor device, the semiconductor device including a conductive resin layer that includes an insulating resin and a plurality of first fillers dispersed in the insulating resin and has a first main surface and a second main surface on a side opposite to the first main surface, and an element layer that is arranged on a first-main-surface side of the conductive resin layer and includes a semiconductor element. The method includes forming the conductive resin layer by die coating using a die head, and forming the element layer. The die head has an opening whose gap dimension is equal to or larger than 100 μm but equal to or smaller than 500 μm. Each of the plurality of first fillers is a fibrous conductive filler. The conductive resin layer has a first surface layer section that includes the first main surface of the conductive resin layer and has a thickness which is 30% of a thickness of the conductive resin layer, a second surface layer section that includes the second main surface of the conductive resin layer and has a thickness which is 30% of the thickness of the conductive resin layer, and an intermediate layer section arranged between the first surface layer section and the second surface layer section. Among the plurality of first fillers, first fillers arranged in the first surface layer section have a directional angle relative to the first main surface which is smaller than a directional angle of first fillers arranged in the intermediate layer section.

According to the embodiments of the present disclosure, it is possible to provide a semiconductor device including a conductive resin layer which includes fibrous conductive fillers and has highly-smooth main surfaces, a display apparatus having the semiconductor device, and a manufacturing method of the semiconductor device.

DETAILED DESCRIPTION OF THE PREFERRED EMBODIMENTS

Embodiments of the present disclosure are explained below by using the figures. Note that all the embodiments explained below represent specific examples of the present disclosure. Accordingly, numerical values, shapes, materials, constituent elements, arrangement positions and modes of connection of the constituent elements, steps, and the order of the steps, for example, that are depicted in the embodiments below are examples and are not aimed to limit the present disclosure. Therefore, constituent elements that are included in constituent elements in the embodiments below but are not described in independent claims representing the most significant concepts in the present disclosure are explained as optional constituent elements.

In addition, each figure is a schematic view, and does not necessarily depict an accurate illustration in a rigorous manner. Accordingly, for example, scales in the figures do not match necessarily. Note that substantially identical configurations are given identical reference symbols in the figures, and overlapping explanations are omitted or simplified.

In addition, in the present specification, terms "upward" and "downward" do not mean the upward direction (vertically upward) and downward direction (vertically downward) in perception of the absolute space but are used as terms specified by relative positional relations on the basis of the stacking order in a stacked configuration. In addition, the terms "upward" and "downward" apply not only to a case where two constituent elements are arranged with an interval therebetween and there is another constituent element between the two constituent elements, but also to a case where the two constituent elements are arranged in contact with each other.

First Embodiment

A semiconductor device, a display apparatus, and methods of manufacturing them according to a first embodiment are explained.

[1-1. Overall Configuration]

Figure 1:
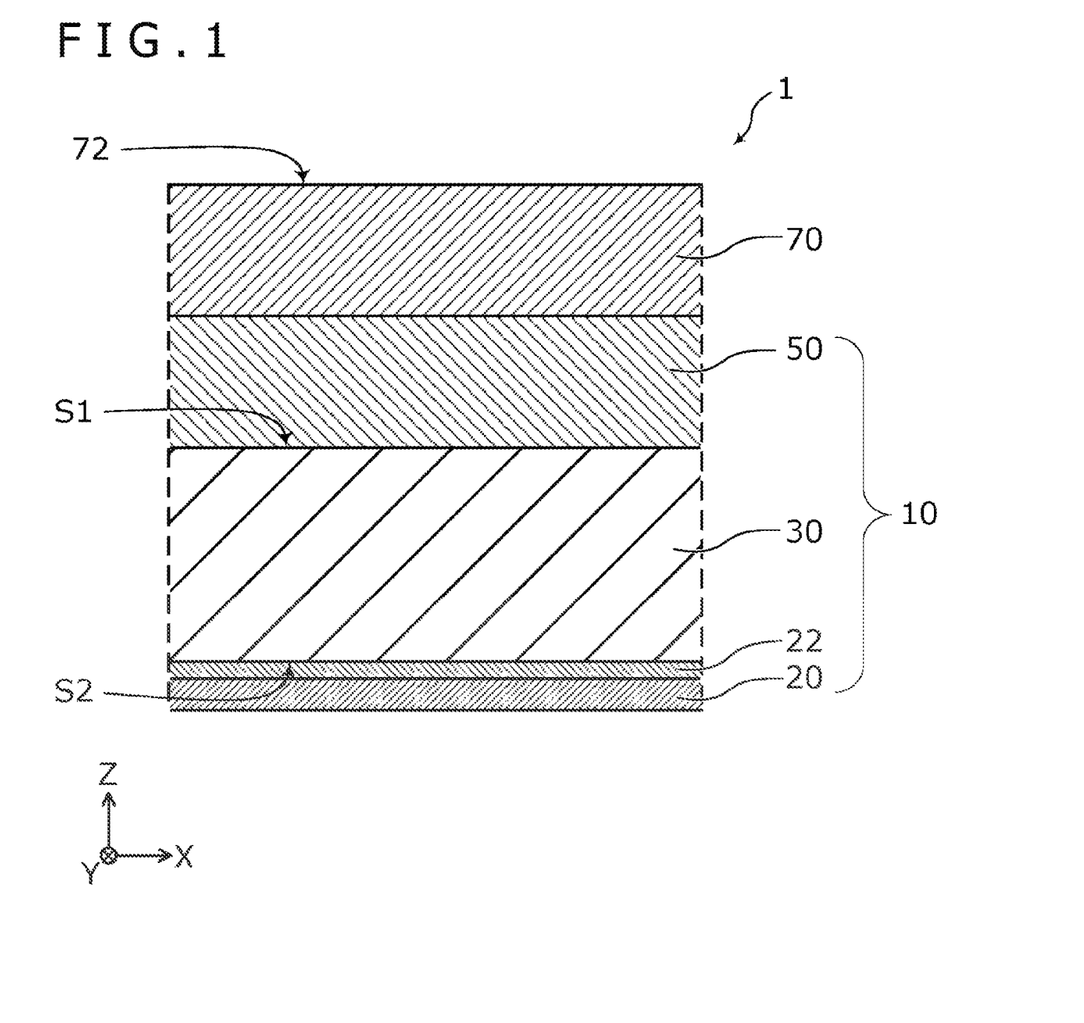
FIG. 1 is a schematic cross-sectional view depicting an example of an overall configuration of a display apparatus according to a first embodiment.

First, an overall configuration of the display apparatus according to the present embodiment is explained by using FIG. 1. FIG. 1 is a schematic cross-sectional view depicting an example of the overall configuration of a display apparatus 1 according to the present embodiment. FIG. 1 depicts part of a cross-section of the display apparatus 1 which is perpendicular to a display surface 72 on which images are displayed. Note that an X-axis, a Y-axis, and a Z axis are depicted in FIG. 1 and the subsequent figures. The X-axis, the Y-axis, and the Z axis represent a right-handed orthogonal coordinate system.

For example, the display apparatus 1 is an organic electroluminescence (EL) display apparatus, and, as depicted in FIG. 1, includes a semiconductor device 10 and a display layer 70.

The display layer 70 is a layer that displays images, and has a display surface 72 on which the images are displayed. For example, the display layer 70 includes a plurality of pixels that are arranged in a matrix. Each of the plurality of pixels includes a display element. For example, the display element is an organic EL element. For example, the organic EL element has an anode electrode, an organic electroluminescence layer, and a cathode electrode in this order from an element-layer-50 side. In the present embodiment, the anode electrode is connected to a source electrode included in the element layer 50. The cathode electrode is supplied with a cathode potential common to the pixels through a wire, for example.

The semiconductor device 10 includes a conductive resin layer 30 and the element layer 50. In the present embodiment, the semiconductor device 10 further includes a conductive sheet 20 and a conductive adhesive layer 22.

The conductive resin layer 30 is a layer that functions as a substrate of the semiconductor device 10. The conductive resin layer 30 has a first main surface S1 and a second main surface S2 on a side opposite to the first main surface S1. In the present embodiment, the conductive resin layer 30 is a flexible layer. This makes it possible to realize a flexible display apparatus 1. By being electrically conductive, the conductive resin layer 30 blocks an electrical field from the second-main-surface-S2 side. In addition, the conductive resin layer 30 is effectively an equipotential region, and it becomes possible to make the potential of the conductive resin layer 30 uniform. This can suppress the lowering of characteristics of a semiconductor element included in the element layer 50. The specific configuration of the conductive resin layer 30 is mentioned later.

The conductive sheet 20 is a metal sheet that is arranged on the second main surface S2 of the conductive resin layer 30 and is electrically conductive. In the present embodiment, the conductive sheet 20 is arranged on the second main surface S2 of the conductive resin layer 30 via the conductive adhesive layer 22. In the present specification, it is expressed that the conductive sheet 20 is arranged on the second main surface S2 also in a case where the conductive sheet 20 is arranged on the second main surface S2 via another member in this manner. The conductive sheet 20 is an example of an electrode that is electrically connected with the conductive resin layer 30 and receives an applied potential. For example, the conductive sheet 20 is supplied with the ground potential or a gate potential applied to a gate electrode 56 mentioned later.

The conductive adhesive layer 22 is an electrically conductive layer arranged between the conductive resin layer 30 and the conductive sheet 20. The conductive adhesive layer 22 joins the conductive sheet 20 to the second main surface S2 of the conductive resin layer 30, and additionally, electrically connects the conductive sheet 20 and the conductive resin layer 30. A conductive adhesive can be used as the conductive adhesive layer 22.

Figure 2:
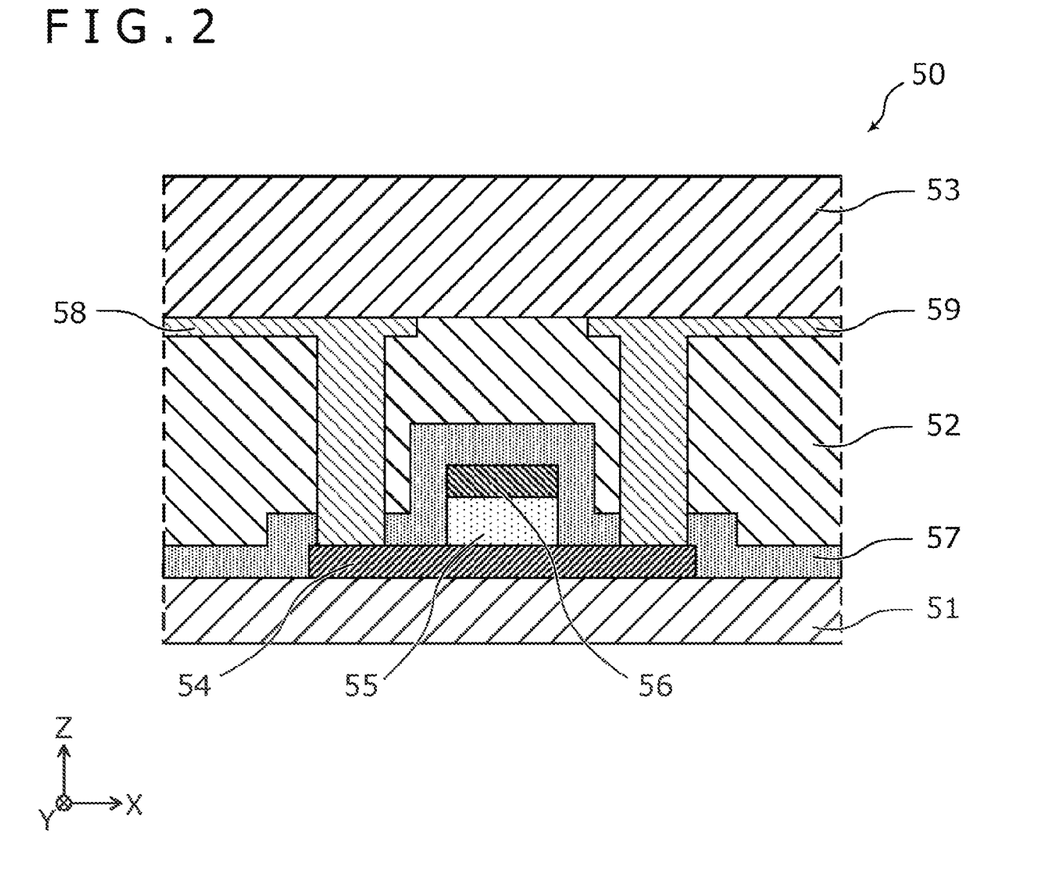
FIG. 2 is a schematic cross-sectional view depicting an example of an element layer according to the first embodiment.

The element layer 50 is a layer that is arranged on the first main surface S1 of the conductive resin layer 30 and includes a semiconductor element. The element layer 50 according to the present embodiment is explained by using FIG. 2. FIG. 2 is a schematic cross-sectional view depicting an example of the element layer 50 according to the present embodiment. As depicted in FIG. 2, the element layer 50 has an insulating film 51, interlayer dielectric films 52 and 53, a semiconductor layer 54, a gate insulating film 55, the gate electrode 56, a protective film 57, a source electrode 58, and a drain electrode 59. The element layer 50 includes a semiconductor element. While the configuration of the semiconductor element is not limited to any particular kind, the semiconductor element is a thin-film transistor in the present embodiment.

The insulating film 51 is provided on the first main surface S1 of the conductive resin layer 30. For example, an inorganic insulating material can be used as the insulating film 51. For example, the insulating film 51 includes a monolayer film or a multilayer film including at least one type selected from a silicon oxide ($SiO_x$), a silicon nitride (SiN), a silicon oxynitride (SiON), and $SiO_x$ doped with phosphorus (P). For example, the thickness of the insulating film 51 is equal to or larger than 200 nm but equal to or smaller than 1000 nm. In addition, an organic insulating film may be provided between the insulating film 51 and the conductive resin layer 30.

The semiconductor layer 54 is formed as a pattern on the insulating film 51. The semiconductor layer 54 includes a channel region in a region that faces the gate electrode 56. For example, the semiconductor layer 54 includes an oxide semiconductor including, as a principal component, an oxide of at least one type of element selected from indium (In), gallium (Ga), zinc (Zn), tin (Sn), titanium (Ti), niobium (Nb), and other elements. Specifically, examples include an indium tin zinc oxide (ITZO), an indium gallium zinc oxide (IGZO: InGaZnO), a zinc oxide (ZnO), an indium zinc oxide (IZO), an indium gallium oxide (IGO), an indium tin oxide (ITO), and an indium oxide (InO). Alternatively, there are no problems even if the semiconductor layer 54 includes a low-temperature polycrystalline silicon (LTPS) or a non-crystalline silicon (a-Si).

For example, the gate insulating film 55 includes a monolayer film including one type selected from a silicon oxide ($SiO_x$), a silicon nitride ($SiN_x$), a silicon oxynitride (SiON), and an aluminum oxide ($AlO_x$), or a multilayer film including two or more types selected from them.

The gate electrode 56 is an electrode that controls the carrier density in the semiconductor layer 54 according to an applied gate potential and that has functionalities as a wire that supplies a potential. For example, examples of a constituent material of the gate electrode 56 include a single element which is one type selected from or an alloy including one type selected from titanium (Ti), tungsten (W), tantalum (Ta), aluminum (Al), molybdenum (Mo), silver (Ag), neodymium (Nd), and copper (Cu). Alternatively, the constituent material of the gate electrode 56 may be a compound including at least one type selected from them or a multilayer film including two or more types selected from them. In addition, for example, there are no problems even if a transparent conductive film such as an ITO is used.

For example, the protective film 57 includes a silicon nitride ($SiN_x$) or an aluminum oxide and functions as a water-vapor barrier film or a hydrogen barrier film.

For example, the interlayer dielectric films 52 and 53 include an organic material such as an acrylic resin, polyimide (PI), or a novolac resin. For example, an inorganic material such as a silicon oxide film, a silicon nitride film, a silicon oxynitride film, or an aluminum oxide may be used for the interlayer dielectric film 52.

The source electrode 58 and the drain electrode 59 function as a source and a drain of the thin-film transistor, respectively, and, for example, include metal or a transparent conductive film similar to those listed as the constituent material of the gate electrode 56. Materials with good electrical conductivity may be selected as the source electrode 58 and the drain electrode 59.

[1-2. Specific Configuration of Conductive Resin Layer]

Figure 3:
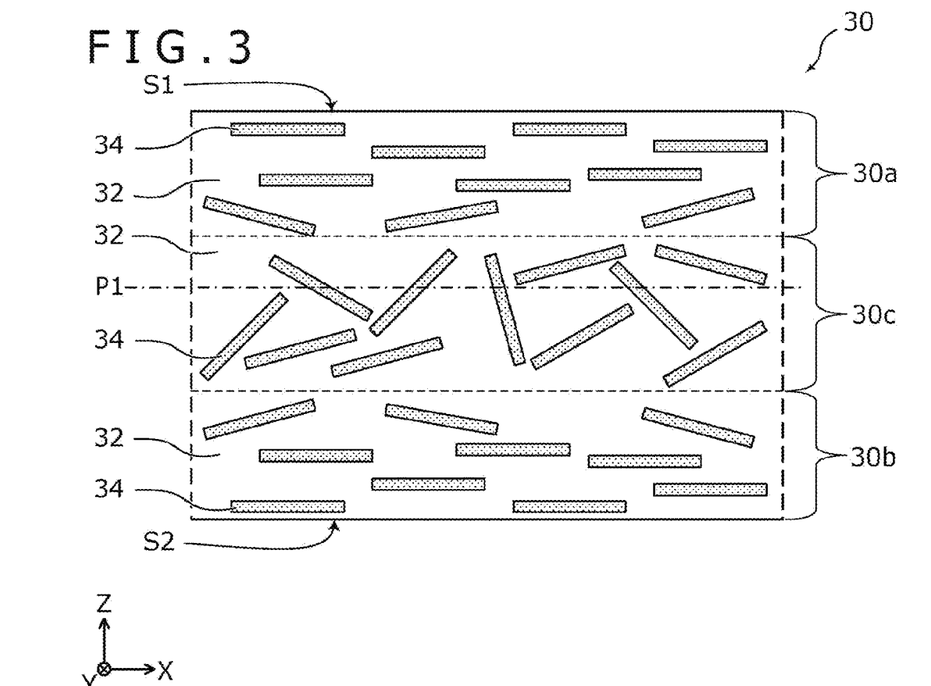
FIG. 3 is a schematic cross-sectional view of a conductive resin layer according to the first embodiment.

The specific configuration of the conductive resin layer 30 according to the present embodiment is explained by using FIG. 3. FIG. 3 is a schematic cross-sectional view of the conductive resin layer 30 according to the present embodiment. As depicted in FIG. 3, the conductive resin layer 30 includes an insulating resin 32 and a plurality of first fillers 34. The thickness of the conductive resin layer 30 is not limited to any particular value. In the present embodiment, the thickness of the conductive resin layer 30 is equal to or larger than 5 μm but equal to or smaller than 20 μm.

The insulating resin 32 is a principal component of the conductive resin layer 30 and maintains the shape of the conductive resin layer 30. While polyimide (PI) is used as the insulating resin 32 in the present embodiment, the material used as the insulating resin 32 is not limited to any particular kind as long as an insulating resin material is used. Other than PI, for example, a resin material such as polyamide, polyamideimide, or an acrylic resin can be used as the insulating resin 32. Note that particularly PI or polyamide may be used as the insulating resin 32. Because PI and polyamide has high heat tolerance, denaturation or other influences can be suppressed even if the insulating resin 32 is heated approximately to, for example, 300° C. to 500° C. at a step of manufacturing the element layer 50. Accordingly, the element layer 50 can be formed directly on the conductive resin layer 30. In a case where a resin material other than PI and polyamide is used as the insulating resin 32, another substrate may be prepared, the element layer 50 may be formed on the substrate, and then the formed element layer 50 may be transferred onto the conductive resin layer 30.

Each of the plurality of first fillers 34 is a fibrous conductive filler and is dispersed in the insulating resin 32. For example, the plurality of first fillers 34 are for blocking an electrical field generated on the second-main-surface-S2 side of the conductive resin layer 30 due to static electricity or other causes, and also for making the conductive resin layer 30 effectively an equipotential region. For example, in a case where a bias temperature stress test is performed on the semiconductor device 10, an electrical field occurs between the gate electrode 56 of the element layer 50 and the conductive sheet 20. At this time, an imbalance of charge distribution occurs due to polarization of the insulating resin 32 included as the base material of the conductive resin layer 30. If the charge distribution changes over time due to the electrical field applied between the gate electrode 56 and the conductive sheet 20, the potential on a back-channel side of the element layer 50 changes, temporal changes of the threshold voltage (Vth) of the thin-film transistor occur, and the reliability of the semiconductor device 10 lowers. Because the conductive resin layer 30 includes the electrically conductive first fillers 34 in the present embodiment, imbalances of the charge distribution in the conductive resin layer 30 can be suppressed, and the charge distribution can be made uniform. Accordingly, temporal changes of the threshold voltage (Vth) of the thin-film transistor in the element layer 50 can be suppressed, and the lowering of the reliability of the semiconductor device 10 can be suppressed.

The surface resistivity of the conductive resin layer 30 including the plurality of first fillers 34 is equal to or lower than $10^4$ Ω/sq, for example. Charging in the first main surface S1 of the conductive resin layer 30 can be suppressed by using the conductive resin layer 30 having surface resistivity of equal to or lower than $10^4$ Ω/sq, so that the influence of an electrical field generated due to static electricity on the semiconductor element included in the element layer 50 can be suppressed sufficiently.

For example, each of the plurality of first fillers 34 is a fibrous conductor. Here, being fibrous means that the conductor has a shape whose length is equal to or larger than 500% of the largest dimension of its cross-section. For example, the length of the first filler 34 is equal to or longer than 1 μm. In addition, for example, the dimension of a cross-section of the first filler 34 perpendicular to the longitudinal axis direction is equal to or larger than 0.4 nm but equal to or smaller than 100 nm. For example, the first fillers 34 include at least one of a carbon fiber, a carbon nanofiber, and a needle-shaped metal oxide. For example, the needle-shaped metal oxide includes a conductive metal oxide such as an indium tin oxide (ITO) or a zinc oxide (ZnO). In the present embodiment, the plurality of first fillers 34 include carbon nanotubes. The carbon nanotubes included in the plurality of first fillers 34 are monolayer or multilayer nanotubes. The carbon nanotubes have low resistance, and additionally, are less prone to breakage. Because of this, for example, even if the conductive resin layer 30 is deformed in a case where the conductive resin layer 30 is flexible, breakage of the first fillers 34 can be suppressed. In addition, the amount of addition of the plurality of first fillers 34 in the present embodiment is approximately 0.1 vol %, for example.

For example, the conductive resin layer 30 including the plurality of first fillers 34 is supplied with the ground potential via the conductive adhesive layer 22 and the conductive sheet 20.

As depicted in FIG. 3, the conductive resin layer 30 has a first surface layer section 30a that includes the first main surface S1 and has a thickness which is 30% of the thickness of the conductive resin layer 30, a second surface layer section 30b that includes the second main surface S2 and has a thickness which is 30% of the thickness of the conductive resin layer 30, and an intermediate layer section 30c arranged between the first surface layer section 30a and the second surface layer section 30b. Among the plurality of first fillers 34, first fillers 34 arranged in the first surface layer section 30a have directional angles relative to the first main surface S1 which are smaller than the directional angles of first fillers 34 arranged in the intermediate layer section 30c. That is, the average value of the directional angles of all the first fillers 34 arranged in the first surface layer section 30a relative to the first main surface S1 is smaller than the average value of the directional angles of all the first fillers 34 arranged in the intermediate layer section 30c.

Here, the directional angles of the first fillers 34 relative to the first main surface S1 are explained. The directional angle of a first filler 34 is an angle representing a directional state of the first filler 34 in the conductive resin layer 30. In the embodiments of the present disclosure, the directional angle of a first filler 34 is an angle ($\leq 90°$) of the longitudinal axis direction of the first filler 34 relative to the first main surface S1 supposing that the angle of a direction parallel to the first main surface S1 of the conductive resin layer 30 is 0° and the angle of a direction perpendicular to the first main surface S1 is 90°.

For example, directional angles can be measured in the following manner. First, an image process analysis is performed by using image analysis software on an image like the one depicted in FIG. 3 obtained from an electron microscopic photograph of a cross-section perpendicular to the first main surface S1 of the conductive resin layer 30. Only fibrous portions are thus extracted from the image, and approximation straight lines of the extracted fibrous portions are obtained. Next, by using a needle separation measurement functionality of the image analysis software, fibrous first fillers 34 are separated. By analyzing the longitudinal axis directions of the separated first fillers 34, the directional angles of the first fillers 34 relative to the first main surface S1 are calculated.

Figure 4:
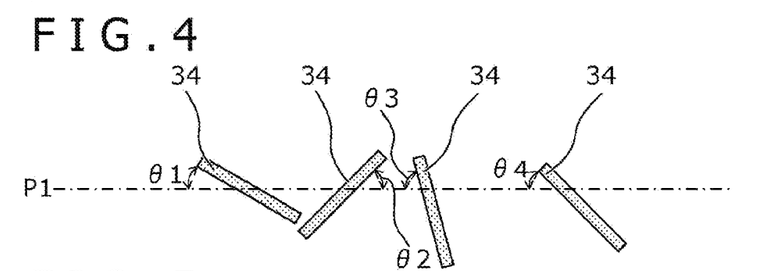
FIG. 4 is a schematic view depicting a directional angle of each first filler crossing a plane parallel to a first main surface of the conductive resin layer according to the first embodiment.

The calculation of the directional angles is performed along a depth direction from the first main surface S1 of the conductive resin layer 30 toward the second main surface S2. The image is divided into image regions at constant intervals in the depth direction, and the average value of all fibrous conductive fillers in a region is treated as the directional angle of the depth. For example, the directional angle of each first filler 34 crossing a plane P1 parallel to the first main surface S1 in FIG. 3 is explained by using FIG. 4. FIG. 4 is a schematic view depicting the directional angle of each first filler 34 crossing the plane P1 parallel to the first main surface S1 of the conductive resin layer 30 according to the present embodiment. As depicted in FIG. 4, the directional angles of the first fillers 34 relative to the first main surface S1 are calculated as angles θ1 to θ4 of the longitudinal axis directions of the first fillers 34 relative to the plane parallel to the first main surface S1.

In the present embodiment, the directional angle of the first fillers 34 arranged in the first surface layer section 30a relative to the first main surface S1 is smaller than the directional angle of the first fillers 34 arranged in the intermediate layer section 30c relative to the first main surface S1. Because of this, it is possible to reduce the likelihood that the first fillers 34 cross the first main surface S1. Accordingly, it is possible to reduce the likelihood that the first fillers 34 stick out from the first main surface S1, and thus, the smoothness of the first main surface S1 can be enhanced. In addition, in the present embodiment, the directional angle of the first fillers 34 arranged in the first surface layer section 30a relative to the first main surface S1 is small, and therefore, the surface conductivity of the first main surface S1 can be made uniform as compared to a case where the directional angle relative to the first main surface S1 is large. Accordingly, an electrical field applied to the element layer 50 from the conductive-resin-layer-30 side of the element layer 50 can be blocked uniformly. As a result, the distribution and strength of an electrical field acting on the element layer 50 from the conductive resin layer 30 can be stabilized by applying a constant potential such as the ground potential to the conductive resin layer 30. Consequently, an operational state of the semiconductor element included in the element layer 50 can be stabilized. In the present embodiment, the surface resistivity in the first main surface S1 and the second main surface S2 of the conductive resin layer 30 can be made equal to or lower than $1 \times 10^4$ Ω/sq. Charging of the conductive resin layer 30 can thus be reduced sufficiently.

In addition, in the present embodiment, the directional angle of the first fillers 34 arranged in the first surface layer section 30a relative to the first main surface S1 is close to 0°. In other words, the directional angle of the first fillers 34 arranged in the first surface layer section 30a relative to the first main surface S1 is equal to or smaller than 10°. Therefore, the smoothness of the first main surface S1 can be enhanced further. In addition, the surface conductivity of the first main surface S1 can be made more uniform.

Note that, in the present embodiment, the directional angle of first fillers 34 arranged in the second surface layer section 30b relative to the first main surface S1 is smaller than the directional angle of the first fillers 34 arranged in the intermediate layer section 30c relative to the first main surface S1. That is, the average value of the directional angles of all the first fillers 34 arranged in the second surface layer section 30b relative to the first main surface S1 is smaller than the average value of the directional angles of all the first fillers 34 arranged in the intermediate layer section 30c. Because of this, the surface conductivity of the second main surface S2 can also be made uniform similarly to the surface conductivity of the first main surface S1.

In addition, because the directional angle of the first fillers 34 arranged in the intermediate layer section 30c relative to the first main surface S1 is large, the first fillers 34 extend in the thickness direction of the conductive resin layer 30.

Accordingly, in the intermediate layer section 30c of the conductive resin layer 30, the electrical conductivity in the thickness direction can be enhanced. Therefore, a potential applied to the second main surface S2 via the conductive sheet 20 and the conductive adhesive layer 22 can be supplied efficiently from the second surface layer section 30b to the first surface layer section 30a.

[1-3. Method of Manufacturing Display Apparatus]

Figure 5:
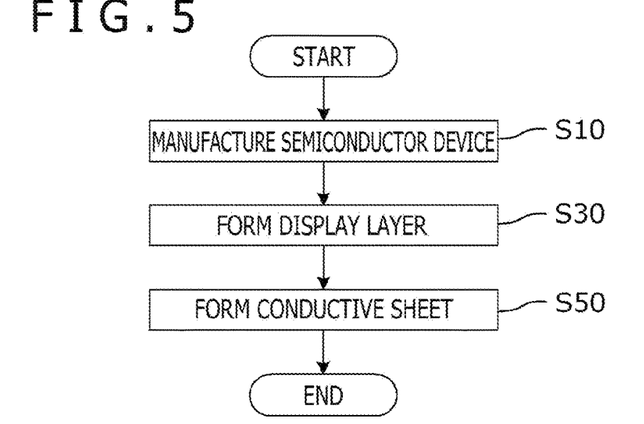
FIG. 5 is a flowchart depicting a flow of a method of manufacturing the display apparatus according to the first embodiment.

Next, a method of manufacturing the display apparatus 1 according to the present embodiment is explained by using FIG. 5. FIG. 5 is a flowchart depicting a flow of the method of manufacturing the display apparatus 1 according to the present embodiment.

Figure 6:
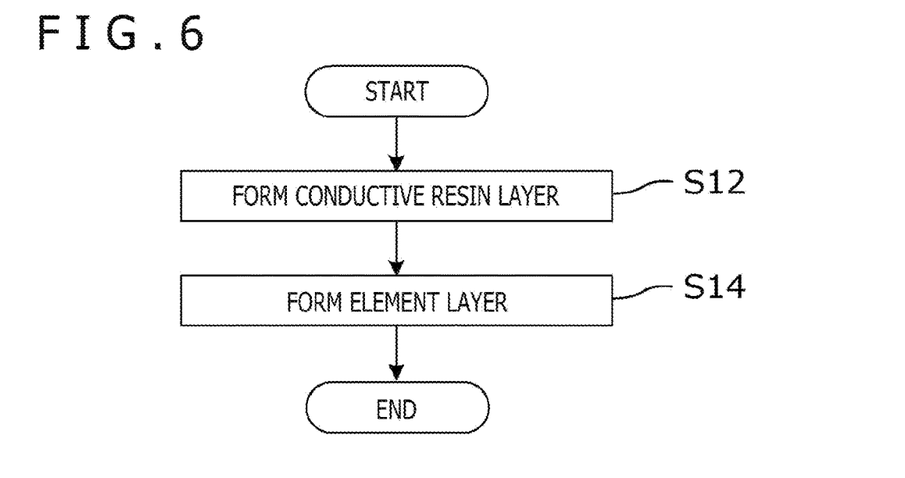
FIG. 6 is a flowchart depicting a flow of a method of manufacturing a semiconductor device according to the first embodiment.

As depicted in FIG. 5, first, the semiconductor device 10 is manufactured (S10). Here, a method of manufacturing the semiconductor device 10 is explained by using FIG. 6. FIG. 6 is a flowchart depicting a flow of the method of manufacturing the semiconductor device 10 according to the present embodiment.

Figure 7:
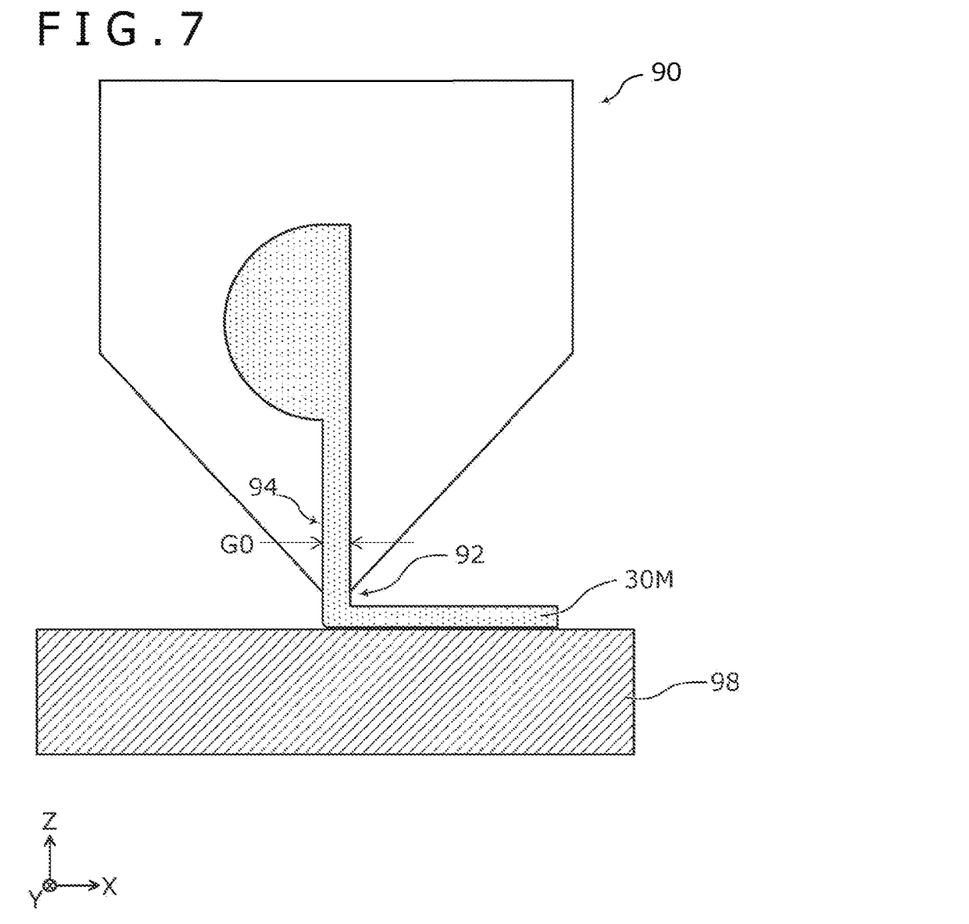
FIG. 7 is a schematic view depicting a step of forming the conductive resin layer according to the first embodiment.

As depicted in FIG. 6, the conductive resin layer 30 is formed (S12). A method of forming the conductive resin layer 30 according to the present embodiment is explained by using FIG. 7. FIG. 7 is a schematic view depicting a step of forming the conductive resin layer 30 according to the present embodiment. As depicted in FIG. 7, in the present embodiment, the conductive resin layer 30 is formed by die coating using a die head 90. Specifically, a support substrate 98 formed of glass or other material is prepared. Next, die coating is performed on a top surface of the support substrate 98 by using the die head 90. The die head 90 has a slot 94 and an opening 92 which is an end section of the slot 94. The slot 94 is filled with varnish 30M including the insulating resin 32 and the plurality of first fillers 34. The die head 90 discharges the varnish 30M onto the top surface of the support substrate 98 via the slot 94 and the opening 92. At this time, the die head 90 or the support substrate 98 is moved in a direction (the X-axis direction in FIG. 7) which is perpendicular to the longitudinal axis direction (the Y-axis direction in FIG. 7) of the slot 94 and is parallel to the top surface of the support substrate 98. The top surface of the support substrate 98 can thus be coated with the varnish 30M. In the present embodiment, a gap dimension GO of the opening 92 is equal to or larger than 100 μm but equal to or smaller than 500 μm.

Figure 8:
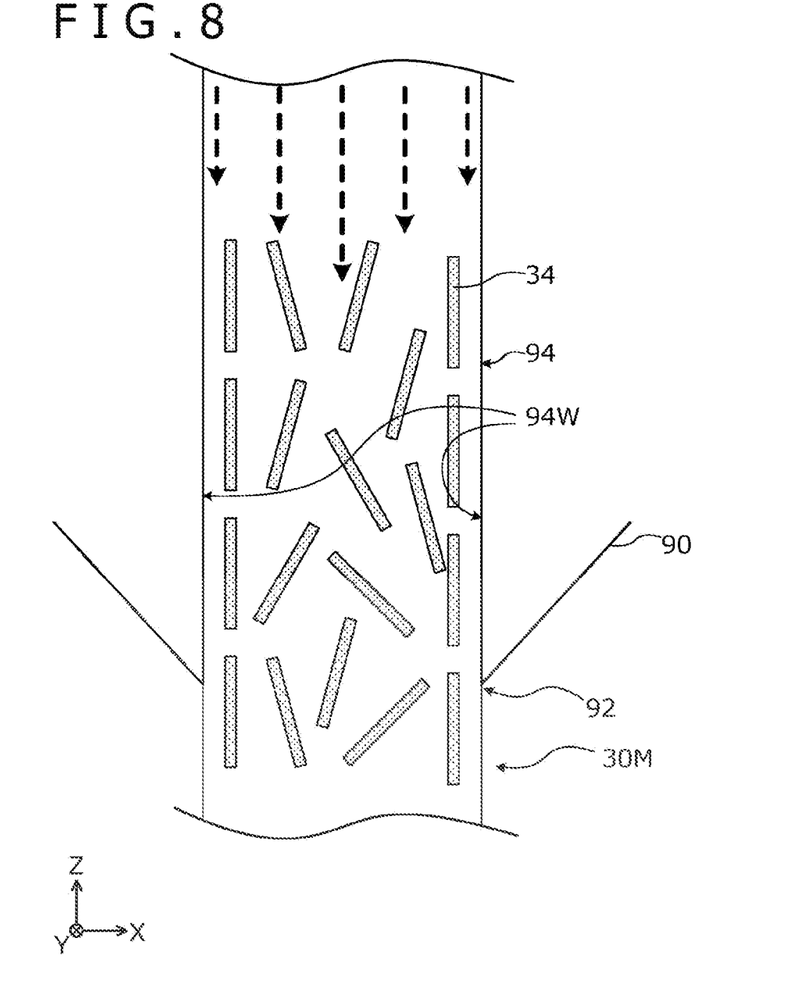
FIG. 8 is a schematic view depicting states of varnish and first fillers in a slot of a die head according to the first embodiment.

Here, states of the varnish 30M and the first fillers 34 in the slot 94 of the die head 90 are explained by using FIG. 8. FIG. 8 is a schematic view depicting the states of the varnish 30M and the first fillers 34 in the slot 94 of the die head 90 according to the present embodiment.

Arrows with broken lines depicted in FIG. 8 represent flow rates of the varnish 30M in the slot 94. The longer the arrows with broken lines are, the higher the flow rates are. That is, there is the highest flow rate at the middle of the slot 94 in the X-axis direction, and flow rates decrease as the varnish 30M gets closer to an inner wall surface 94W of the slot 94. In this manner, the flow of the varnish 30M in the slot 94 is a shear flow. In this case, among the plurality of first fillers 34 included in the varnish 30M, the directions of first fillers 34 positioned near the inner wall surface 94W coincide with the direction of the flow of the varnish 30M (i.e., the Z-axis direction in FIG. 8) due to the influence of the shear flow. On the other hand, first fillers 34 positioned near the middle in the slot 94 in the X-axis direction point to random directions or to directions substantially perpendicular to the direction of the flow. Each first filler 34 is arranged on the top surface of the support substrate 98 while maintaining such a directional state. Thus, the directions of first fillers 34 that are included in the varnish 30M applied onto the top surface of the support substrate 98 and that are arranged at a portion near the top surface (i.e., a portion farthest from the top surface of the support substrate 98) and a portion near the bottom surface (i.e., a portion near the top surface of the support substrate 98) are close to the direction parallel to the top surface and the bottom surface of the varnish 30M. On the other hand, first fillers 34 that are arranged near the middle, in the up-down direction (i.e., the Z-axis direction), of the varnish 30M applied onto the top surface of the support substrate 98 point to random directions or to directions substantially perpendicular to the top surface and the bottom surface of the varnish 30M.

Next, a process of hardening the varnish 30M applied onto the top surface of the support substrate 98 is performed. For example, the hardening process includes a drying step and a baking step. For example, as the drying step, drying under reduced pressure can be used. For example, at the baking step, the dried varnish 30M is heated to 400° C. or higher. The conductive resin layer 30 including the insulating resin 32 and the plurality of first fillers 34 can thus be formed on the top surface of the support substrate 98. Here, the directional state of each of the plurality of first fillers 34 is similar to the directional state that is available immediately after the coating of the varnish 30M. Accordingly, due to the step of forming the conductive resin layer 30 described above, among the plurality of first fillers 34, first fillers 34 arranged in the first surface layer section 30a and the second surface layer section 30b have directional angles relative to the first main surface S1 which are smaller than the directional angle of first fillers 34 arranged in the intermediate layer section 30c.

Next, described with reference to FIG. 6 again, subsequently to the step of forming the conductive resin layer 30, the element layer 50 is formed (S14). Specifically, the insulating film 51, the semiconductor layer 54, the gate insulating film 55, the gate electrode 56, the protective film 57, the interlayer dielectric film 52, the source electrode 58 and drain electrode 59, and the interlayer dielectric film 53 are formed on the first main surface S1 of the conductive resin layer 30 in this order. Specifically, for example, these are formed in the following manner.

First, the insulating film 51 including an inorganic insulating material is formed on the entire first main surface S1 of the conductive resin layer 30 by using chemical vapor deposition (CVD), for example. Next, the semiconductor layer 54 including the material mentioned above (e.g., an oxide semiconductor) is formed on the insulating film 51 by sputtering, for example, and then patterning of the semiconductor layer 54 into a predetermined shape is performed by photolithography and etching, for example. Next, the gate insulating film 55 including the material mentioned above is formed by using CVD, for example. Thereafter, after pattern formation of the gate electrode 56 including the material mentioned above on the gate insulating film 55, the gate insulating film 55 is etched by using the gate electrode 56 as a mask, to thereby perform patterning of the gate insulating film 55. Next, the protective film 57 and the interlayer dielectric film 52 are formed, and then, contact holes are formed in regions that face part of the semiconductor layer 54. Thereafter, the source electrode 58 and the drain electrode 59 including the metal materials mentioned above are formed on the interlayer dielectric film 52 in such a manner that the source electrode 58 and the drain electrode 59 fill the contact holes. Thereafter, the interlayer dielectric film 53 is formed in such a manner that the interlayer dielectric film 53 covers the source electrode 58 and the drain electrode 59. The element layer 50 can be formed in the manner mentioned above.

The semiconductor device 10 can be manufactured in the manner mentioned above.

Next, described with reference to FIG. 5 again, the display layer 70 is formed on the element layer 50 (S30). For example, in a case where the display layer 70 includes an organic EL element, the display layer 70 including the anode electrode, the organic electro-luminescence layer, and the cathode electrode is formed on the element layer 50.

After the display layer 70 is formed in this manner, the support substrate 98 is peeled off from the conductive resin layer 30. For example, the support substrate 98 is peeled off by what is generally called laser lift off (LLO) which is a method in which the bottom-surface side of the support substrate 98 is irradiated with laser light L.

Last, the conductive sheet 20 is formed on the second main surface S2 of the conductive resin layer 30 (550). Specifically, the conductive sheet 20 is joined with the second main surface S2 of the conductive resin layer 30 by using the conductive adhesive layer 22. The display apparatus 1 like the one depicted in FIG. 1 can thus be manufactured.

Note that the step of forming the conductive sheet 20 may be part of the step of manufacturing the semiconductor device 10. That is, the method of manufacturing the semiconductor device 10 may include the step of forming the conductive sheet 20.

Second Embodiment

A semiconductor device and a display apparatus according to a second embodiment are explained. The semiconductor device and the display apparatus according to the present embodiment are different from the semiconductor device 10 and the display apparatus 1 according to the first embodiment in that a conductive resin layer includes granular second fillers, but are the same in other respects. The semiconductor device and the display apparatus according to the present embodiment are explained below by using FIG. 9 with focus on the difference from the semiconductor device 10 and the display apparatus 1 according to the first embodiment.

Figure 9:
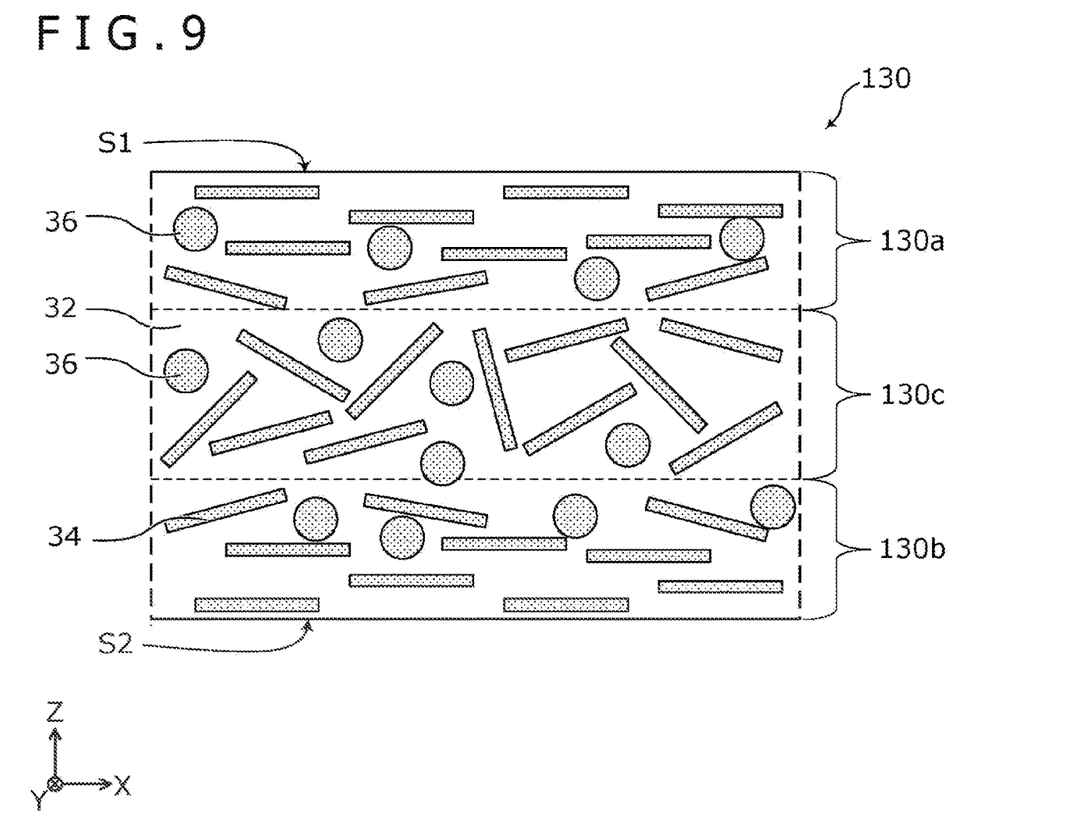
FIG. 9 is a schematic cross-sectional view of a conductive resin layer according to a second embodiment.

FIG. 9 is a schematic cross-sectional view of a conductive resin layer 130 according to the present embodiment. As depicted in FIG. 9, as in the first embodiment, the conductive resin layer 130 includes the insulating resin 32 and the plurality of first fillers 34 and has the first main surface S1 and the second main surface S2. In addition, the conductive resin layer 130 has a first surface layer section 130a that includes the first main surface S1 and has a thickness which is 30% of the thickness of the conductive resin layer 130, a second surface layer section 130b that includes the second main surface S2 and has a thickness which is 30% of the thickness of the conductive resin layer 130, and an intermediate layer section 130c arranged between the first surface layer section 130a and the second surface layer section 130b. Among the plurality of first fillers 34, first fillers 34 arranged in the first surface layer section 130a and the second surface layer section 130b have directional angles relative to the first main surface S1 which are smaller than the directional angles of first fillers 34 arranged in the intermediate layer section 130c.

In the present embodiment, the conductive resin layer 130 further includes a plurality of second fillers 36. Each of the plurality of second fillers 36 is a granular conductive filler. Here, being granular means that the filler has a shape whose length is equal to or smaller than 300% of the largest dimension of its cross-section. In the present embodiment, each of the plurality of second fillers 36 has a substantially spherical shape. For example, the diameter (or dimension) of the second filler 36 is equal to or larger than 0.4 nm but equal to or smaller than 100 nm. The second fillers 36 include at least one of a carbon black, metal particles, and metal oxide particles.

Because the directions of a first filler 34 and another first filler 34 arranged in the first surface layer section 130a and the second surface layer section 130b are relatively the same, the likelihood that those first fillers 34 come into contact is relatively low. However, because the conductive resin layer 130 includes the granular second fillers 36 in the present embodiment, a first filler 34 can be electrically connected with another first filler 34 via a second filler 36. Accordingly, in the present embodiment, by including the plurality of second fillers 36, the conductive resin layer 30 can have further enhanced intra-layer electrical conductivity.

In addition, by including the granular second fillers 36, the conductive resin layer 130 can have slightly lowered uniformity of the directional angles of the plurality of first fillers 34. Therefore, it is possible to increase the probability that a first filler 34 and another first filler 34 come into contact with each other. Accordingly, the electrical conductivity of the conductive resin layer 130 can further be enhanced.

Third Embodiment

A semiconductor device and a display apparatus according to a third embodiment are explained. The semiconductor device and the display apparatus according to the present embodiment are different from the semiconductor device 10 and the display apparatus 1 according to the first embodiment in that a metal layer is further included, but are the same in other respects. The semiconductor device and the display apparatus according to the present embodiment are explained below by using FIG. 10 with focus on the difference from the semiconductor device 10 and the display apparatus 1 according to the first embodiment.

Figure 10:
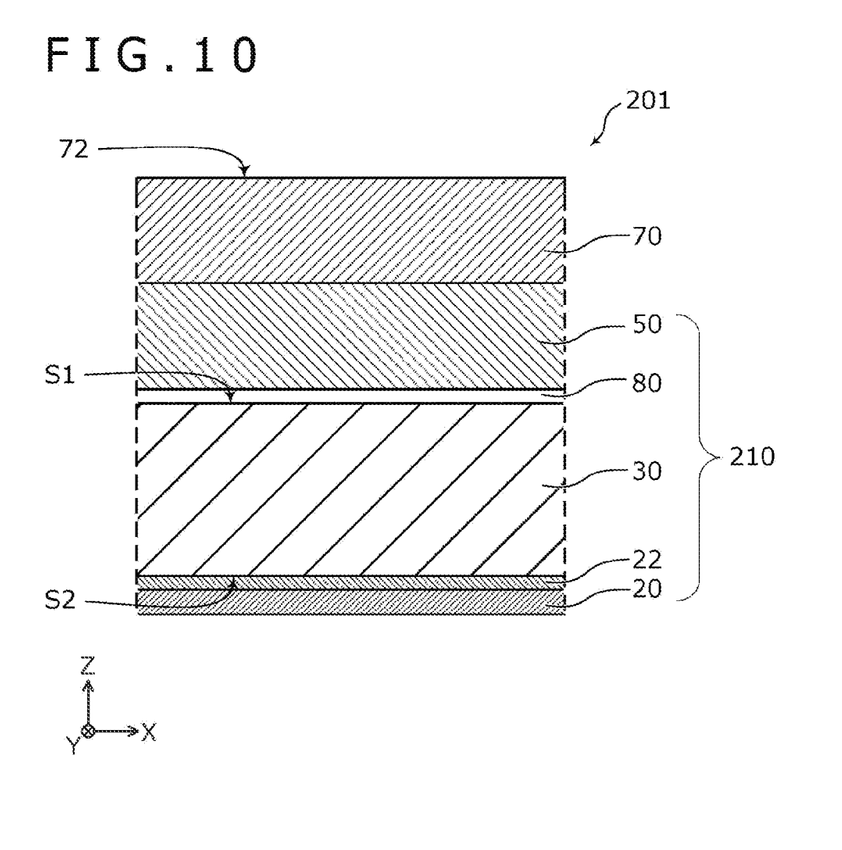
FIG. 10 is a schematic cross-sectional view depicting an example of an overall configuration of a display apparatus according to a third embodiment.

FIG. 10 is a schematic cross-sectional view depicting an example of an overall configuration of a display apparatus 201 according to the present embodiment. FIG. 10 depicts part of a cross-section of the display apparatus 201 which is perpendicular to a display surface 72 on which images are displayed.

As depicted in FIG. 10, the display apparatus 201 according to the present embodiment includes a semiconductor device 210 and the display layer 70. Similarly to the semiconductor device 10 according to the first embodiment, the semiconductor device 210 includes the conductive resin layer 30, the element layer 50, the conductive sheet 20, and the conductive adhesive layer 22. In the present embodiment, the semiconductor device 210 further includes a metal layer 80.

The metal layer 80 is a layer that is arranged between the conductive resin layer 30 and the element layer 50 and that includes a metal material. The metal layer 80 is arranged on the first main surface S1 of the conductive resin layer 30. For example, examples of a material included in the metal layer 80 include a single element which is one type selected from or an alloy including one type selected from titanium (Ti), tungsten (W), tantalum (Ta), aluminum (Al), molybdenum (Mo), silver (Ag), neodymium (Nd), and copper (Cu). Alternatively, the material included in the metal layer 80 may be a compound including at least one type selected from them or a multilayer film including two or more types selected from them. In addition, for example, the metal layer 80 may be a transparent conductive film such as an ITO. For example, the thickness of the metal layer 80 is equal to or larger than 100 nm but equal to or smaller than 200 nm.

For example, the metal layer 80 is formed on the first main surface S1 of the conductive resin layer 30 by sputtering or other method. At this time, the metal layer 80 and the first fillers 34 come into contact with each other on the first main surface S1 of the conductive resin layer 30, and the metal layer 80 forms an equipotential surface which is continuous with the surface of the conductive resin layer 30. In addition, even if recesses and projections attributable to the first fillers 34 are formed, the recesses and projections of the first main surface S1 can be smoothened by metal particles included in the metal layer 80. Accordingly, the element layer 50 can be formed on the highly-smooth top surface of the metal layer 80 forming the equipotential surface. A potential on the back-channel side of each layer included in the element layer 50 can thus be made uniform, and also the smoothness can be enhanced. Therefore, the lowering of characteristics of the semiconductor element such as a thin-film transistor included in the element layer 50 can be suppressed.

OTHER EMBODIMENTS

While the semiconductor device, the display apparatus, and the manufacturing method according to the present disclosure have been explained on the basis of embodiments thus far, the semiconductor device, the display apparatus, and the manufacturing method according to the present disclosure are not limited to the embodiments described above. The present disclosure also includes other embodiments realized by combining any constituent elements in the embodiments, modification examples obtained by making various types of modification to the embodiments that those skilled in the art can conceive of within the scope not deviating from the gist of the present disclosure, and various types of equipment incorporating a processing circuit and other components according to the present embodiment.

For example, the present disclosure is useful for a flexible organic EL flat panel display.

The present disclosure contains subject matter related to that disclosed in Japanese Priority Patent Application JP 2021-056354 filed in the Japan Patent Office on Mar. 30, 2021, the entire content of which is hereby incorporated by reference.

What is claimed is:

1. A semiconductor device comprising:
a conductive resin layer that includes an insulating resin and a plurality of first fillers dispersed in the insulating resin and has a first main surface and a second main surface on a side opposite to the first main surface; and
an element layer that is arranged on the first main surface and includes a semiconductor element, wherein
each of the plurality of first fillers is a fibrous conductive filler,
the conductive resin layer has
a first surface layer section that includes the first main surface and has a thickness which is 30% of a thickness of the conductive resin layer,
a second surface layer section that includes the second main surface and has a thickness which is 30% of the thickness of the conductive resin layer, and
an intermediate layer section arranged between the first surface layer section and the second surface layer section, and,
among the plurality of first fillers, first fillers arranged in the first surface layer section have a directional angle relative to the first main surface which is smaller than a directional angle of first fillers arranged in the intermediate layer section.

2. The semiconductor device according to claim 1, wherein the directional angle of the first fillers arranged in the first surface layer section relative to the first main surface is equal to or smaller than 10°.

3. The semiconductor device according to claim 1, wherein the plurality of first fillers include at least one of a carbon fiber, a carbon nanofiber, and a needle-shaped metal oxide.

4. The semiconductor device according to claim 3, wherein the plurality of first fillers include a carbon nanotube.

5. The semiconductor device according to claim 1, wherein
the conductive resin layer further includes a plurality of second fillers, and
each of the plurality of second fillers is a granular conductive filler.

6. The semiconductor device according to claim 5, wherein the plurality of second fillers include at least one of a carbon black, metal particles, and metal oxide particles.

7. The semiconductor device according to claim 1, further comprising:
a metal layer arranged between the conductive resin layer and the element layer.

8. The semiconductor device according to claim 1, further comprising:
an electrode that is electrically connected with the conductive resin layer and receives an applied potential.

9. The semiconductor device according to claim 8, wherein the electrode includes a conductive sheet arranged on the second main surface.

10. The semiconductor device according to claim 1, wherein the semiconductor element is a thin-film transistor.

11. A display apparatus comprising:
the semiconductor device according to claim 1; and
a display layer that is arranged on the element layer and displays an image.

12. A method of manufacturing a semiconductor device, the semiconductor device including
a conductive resin layer that includes an insulating resin and a plurality of first fillers dispersed in the insulating resin and has a first main surface and a second main surface on a side opposite to the first main surface, and
an element layer that is arranged on a first-main-surface side of the conductive resin layer and includes a semiconductor element,
the method comprising:
forming the conductive resin layer by die coating using a die head; and
forming the element layer, wherein
the die head has an opening whose gap dimension is equal to or larger than 100 μm but equal to or smaller than 500 μm,
each of the plurality of first fillers is a fibrous conductive filler,
the conductive resin layer has a first surface layer section that includes the first main surface of the conductive resin layer and has a thickness which is 30% of a thickness of the conductive resin layer,
a second surface layer section that includes the second main surface of the conductive resin layer and has a thickness which is 30% of the thickness of the conductive resin layer, and
an intermediate layer section arranged between the first surface layer section and the second surface layer section, and,
among the plurality of first fillers, first fillers arranged in the first surface layer section have a directional angle relative to the first main surface which is smaller than a directional angle of first fillers arranged in the intermediate layer section.

\* \* \* \* \*